(12) United States Patent
Mikuteit (10) Patent No.: US 9,797,959 B2
(45) Date of Patent: Oct. 24, 2017

(54) BATTERY FUEL GAUGES USING FET SEGMENT CONTROL TO INCREASE LOW CURRENT MEASUREMENT ACCURACY

(71) Applicant: QUALCOMM Incorporated, San Diego, CA (US)

(72) Inventor: Eric I Mikuteit, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 660 days.

(21) Appl. No.: 14/084,398

(22) Filed: Nov. 19, 2013

(65) Prior Publication Data

US 2015/0137820 A1    May 21, 2015

(51) Int. Cl.
| | |
|---|---|
| *G01N 27/416* | (2006.01) |
| *G01R 31/36* | (2006.01) |
| *G01R 15/09* | (2006.01) |
| *G01R 19/00* | (2006.01) |
| *G01R 1/20* | (2006.01) |
| *H01M 10/48* | (2006.01) |

(52) U.S. Cl.
CPC ......... *G01R 31/3644* (2013.01); *G01R 15/09* (2013.01); *G01R 19/0092* (2013.01); *G01R 1/203* (2013.01); *G01R 31/3624* (2013.01); *H01M 10/48* (2013.01); *H03K 2217/0027* (2013.01)

(58) Field of Classification Search
CPC ................................................. G01R 31/3644
USPC .................................. 307/130, 131; 324/426
See application file for complete search history.

(56) References Cited

U.S. PATENT DOCUMENTS

| | | |
|---|---|---|
| 5,319,305 A | 6/1994 | Baba |
| 6,262,670 B1 | 7/2001 | Ballou |
| 6,414,404 B1 | 7/2002 | Allen |

(Continued)

FOREIGN PATENT DOCUMENTS

| | | |
|---|---|---|
| CN | 102539869 A | 7/2012 |
| EP | 0990967 A2 | 4/2000 |

(Continued)

OTHER PUBLICATIONS

International Search Report and Written Opinion—PCT/US2014/066163—ISA/EPO—May 19, 2015.

(Continued)

*Primary Examiner* — Drew A Dunn
*Assistant Examiner* — Zixuan Zhou
(74) *Attorney, Agent, or Firm* — Haynes and Boone, LLP (57) ABSTRACT

A circuit comprises a battery field-effect transistor (FET) coupled between a battery and an electronic system so that current from the battery flows through the battery FET to the electronic system. A replica FET couples the battery to a current sensing circuit. One of the battery FET and the replica FET comprises a plurality of parallel FET segments having separate control terminals. A logic block provides a plurality of switch control signals based on a system state input. A switching circuit receives the switch control signals and selectively couples the separate control terminals of the FET segments to one of a first reference voltage terminal or a second reference voltage terminal to independently turn each FET segment on or off. The current sensing circuit provides a voltage indicative of the current flowing through the replica FET.

8 Claims, 11 Drawing Sheets

(56) References Cited

U.S. PATENT DOCUMENTS

| | | | |
|---|---|---|---|
| 8,294,424 B2 | 10/2012 | Bucur | |
| 2004/0155662 A1* | 8/2004 | Graf | G01R 19/0092 |
| | | | 324/522 |
| 2005/0128671 A1 | 6/2005 | Miyamoto | |
| 2009/0121729 A1 | 5/2009 | Farkas | |
| 2010/0007327 A1 | 1/2010 | Andoh et al. | |
| 2011/0291485 A1 | 12/2011 | Canclini et al. | |
| 2012/0019405 A1* | 1/2012 | Nadimpalli | G05F 1/575 |
| | | | 341/153 |
| 2013/0093429 A1 | 4/2013 | Huang et al. | |
| 2013/0175994 A1 | 7/2013 | Endo et al. | |
| 2013/0204560 A1 | 8/2013 | Lo et al. | |
| 2013/0214804 A1* | 8/2013 | Dietz | G01R 1/203 |
| | | | 324/713 |

FOREIGN PATENT DOCUMENTS

| | | |
|---|---|---|
| EP | 1017173 A2 | 7/2000 |
| EP | 2746890 A1 | 6/2014 |

OTHER PUBLICATIONS

Partial International Search Report—PCT/US2014/066163—ISA/EPO—Mar. 18, 2015.

\* cited by examiner

BATTERY FUEL GAUGES USING FET SEGMENT CONTROL TO INCREASE LOW CURRENT MEASUREMENT ACCURACY

BACKGROUND

The disclosure relates to battery fuel gauges, and in particular, to battery fuel gauges using field-effect transistor (FET) or resistor segment control to increase low current measurement accuracy.

Unless otherwise indicated herein, the approaches described in this section are not admitted to be prior art by inclusion in this section.

Figure 1:
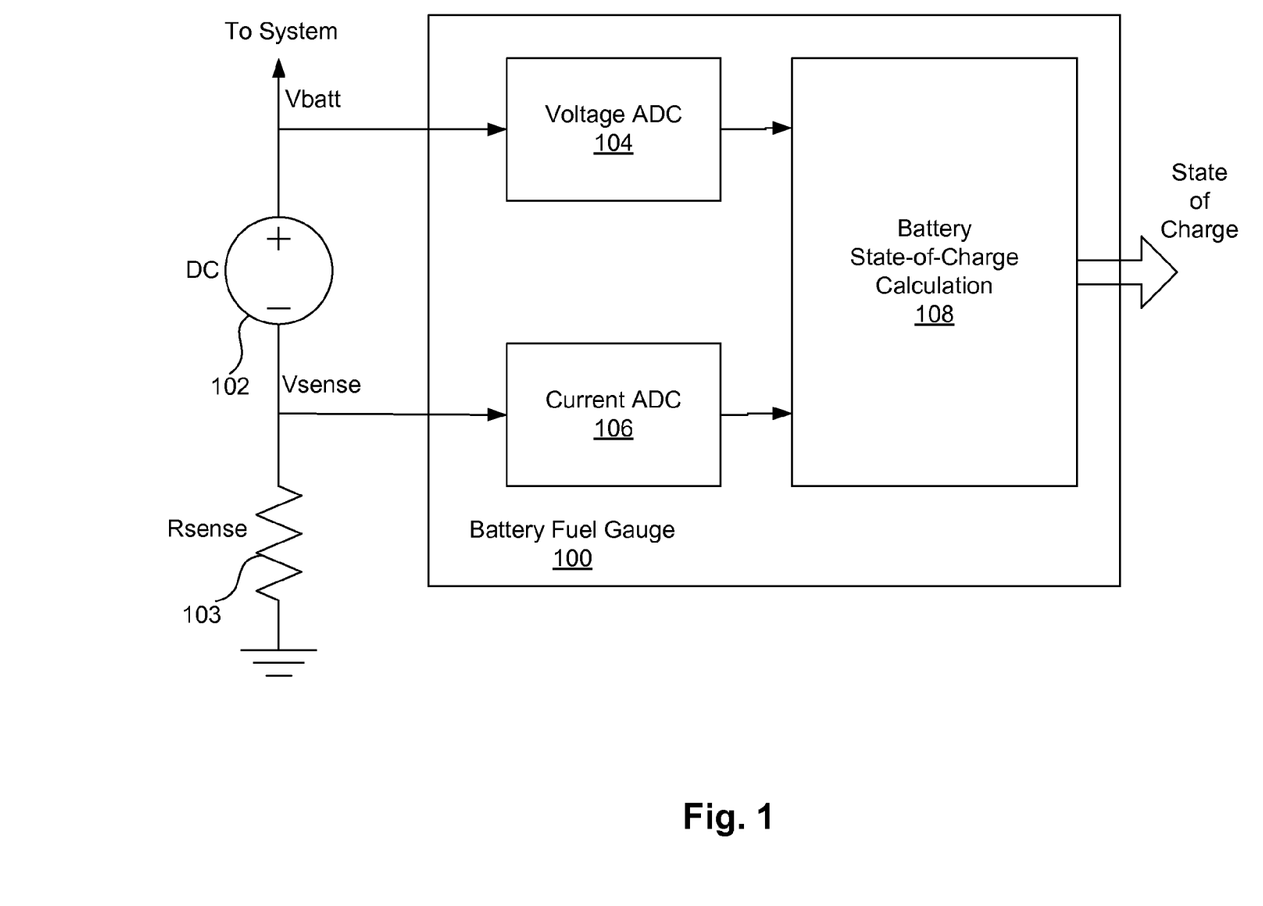
FIG. 1 illustrates a block diagram of a conventional battery fuel gauge employing low-side sensing.

Battery operated electronic devices often include circuitry for measuring the current flowing out of or into the battery. Such circuits are sometimes referred to as "Battery Fuel Gauges." A typical Battery Fuel Gauge circuit 100 is shown in FIG. 1. The circuit 100 may measure current to and from a battery 102 and a voltage on the battery 102 to determine a state of charge (SOC) of the battery 102. The circuit 100 may include a battery voltage analog to digital converter (ADC) 104 and a battery current ADC 106. The voltage ADC 104 may convert a battery voltage Vbatt into a digital value, and the current ADC 106 may convert battery current sensed as voltage across a sense resistor 103 into a digital value. The digital battery voltage and battery current measurements are used by a battery state of charge calculation block 108 to determine state of charge of the battery 102.

Figure 2:
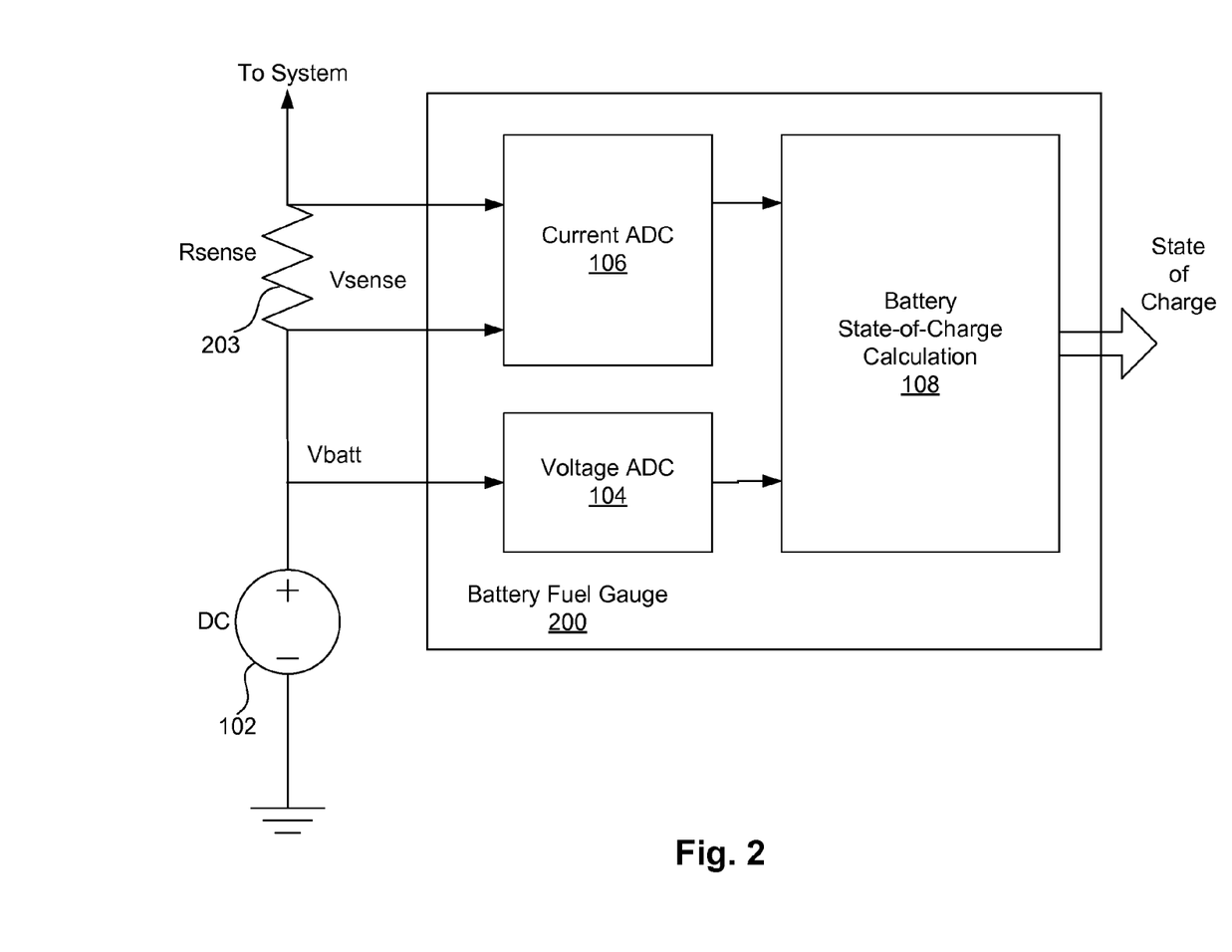
FIG. 2 illustrates a block diagram of a conventional battery fuel gauge employing high-side sensing.
Figure 3:
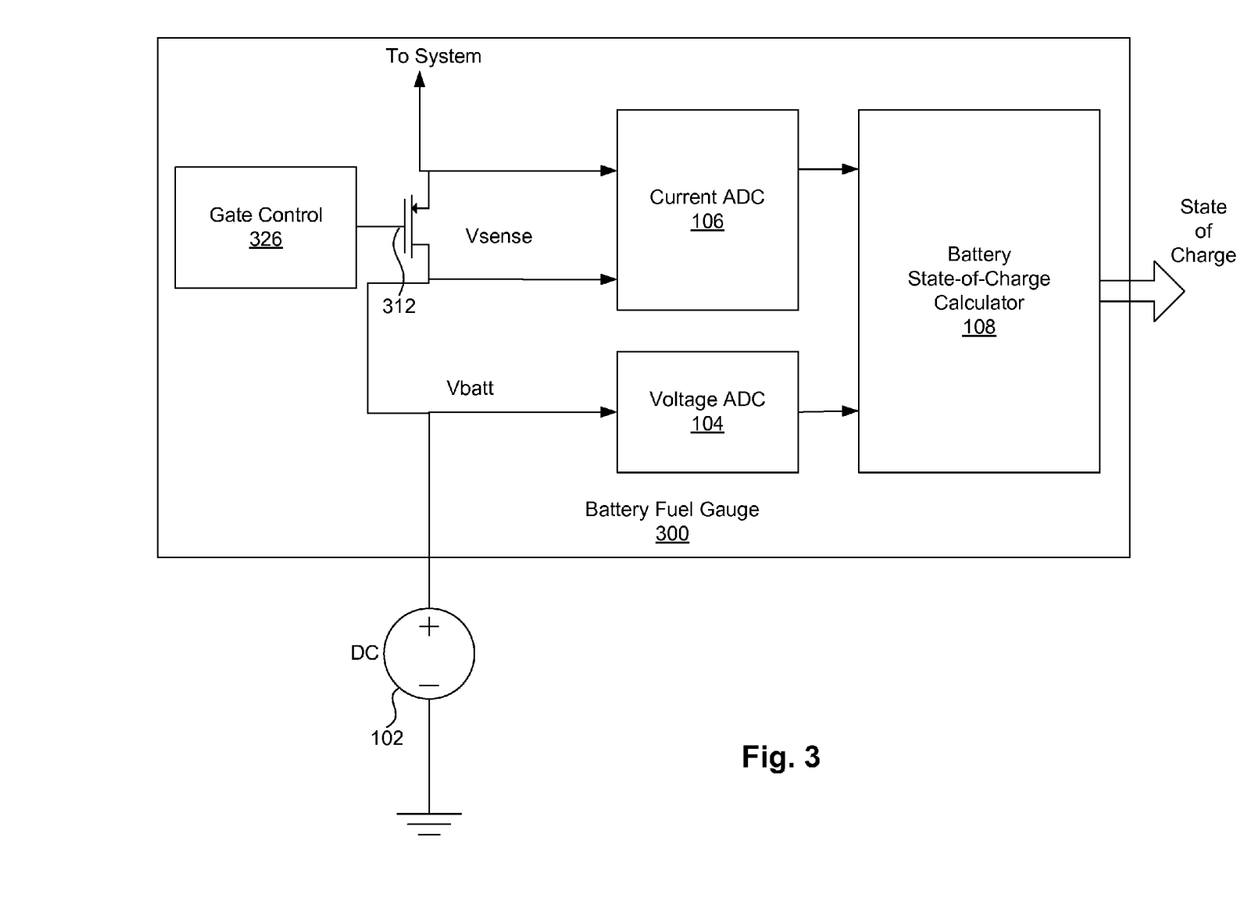
FIG. 3 illustrates a block diagram of a conventional battery fuel gauge employing a FET sensing element.
Figure 4:
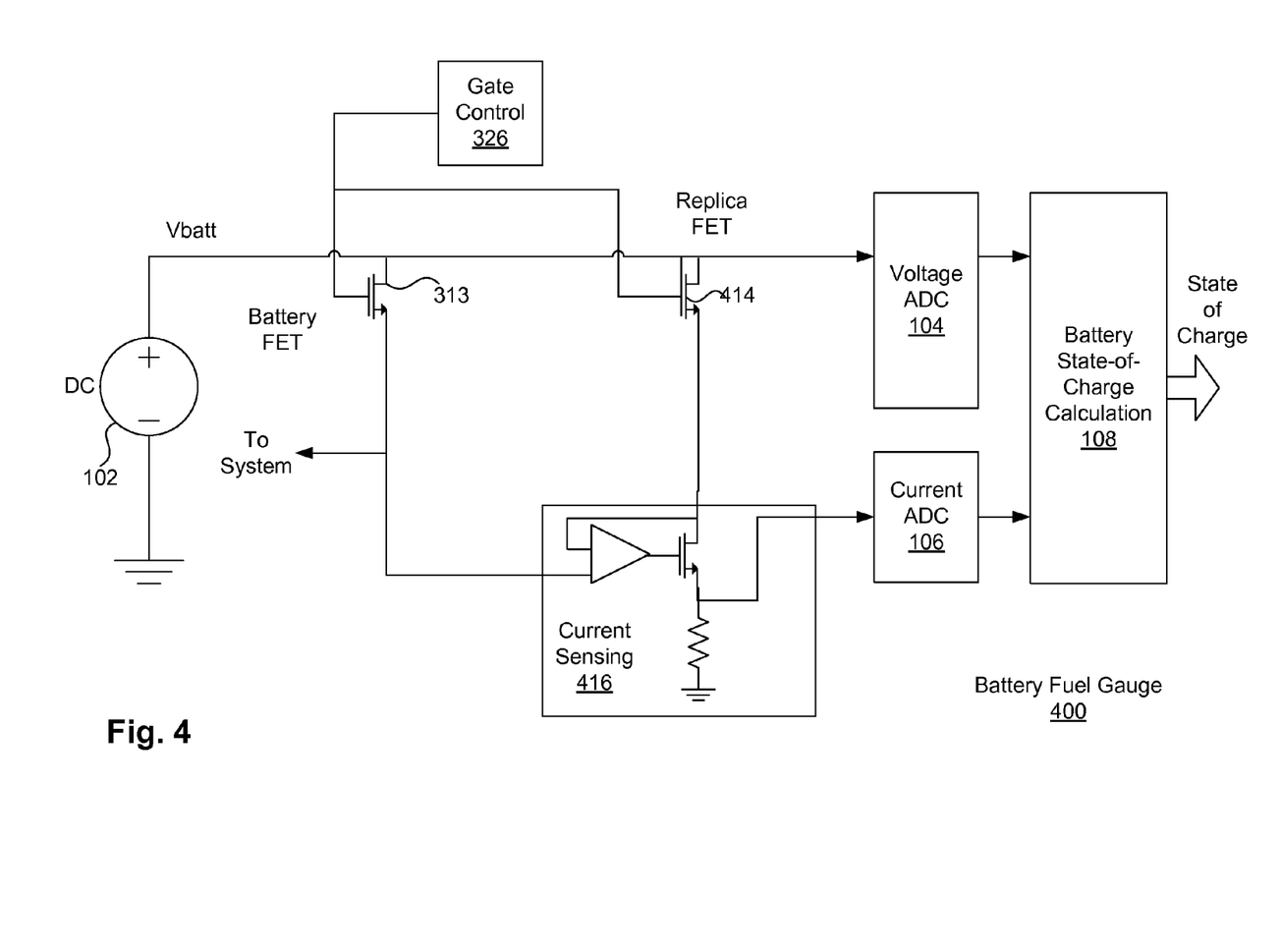
FIG. 4 illustrates a block diagram of a battery fuel gauge employing replica current sensing.

One prior approach to detecting battery current measures a voltage across a high-side sense resistor 203 in series with the battery 102 in a battery fuel gauge circuit 200 as illustrated in FIG. 2. Another approach, battery fuel gauge 300 as illustrated in FIG. 3, has been to use a drain-source ON resistance (Rds(on)) of a field effect transistor (FET) 312 controlled by a gate control block 326. Yet another approach, battery fuel gauge 400 as illustrated in FIG. 4, has been to use replica sensing using a replica mirror current from a replica FET 414 that is scaled relative to the primary current from the battery FET 312. A sensing circuit 416 generates a voltage based on the replica mirror current and the primary current for the current ADC. However, these techniques are problematic because the battery current can fluctuate across a wide range of values. For example, when the system is drawing high currents (e.g., during normal or high demand system operating modes), a particular resistance value may be used to meet the range of the current ADC input. However, when the current drops due to the system entering sleep or standby modes, a series resistance value usable for higher current modes will produce very small voltage drops at the current ADC input. Reading low voltages by an ADC is very error prone, and solutions to such errors can be expensive and complicated.

SUMMARY

The present disclosure describes a circuit for increasing low current measurement accuracy using field-effect transistor (FET) segment control. In one embodiment, a circuit comprises a field-effect transistor (FET) having a first terminal configured to be coupled to a battery and a second terminal configured to be coupled to an electronic system. Current from the battery flows through the FET to the electronic system. The FET comprises a plurality of parallel FET segments having separate control terminals. A logic block has an input to receive a system state input and has an output to provide a plurality of switch control signals based on the system state input. A switching circuit has first terminals coupled to the plurality of switch control signals and has second terminals independently coupled to the separate control terminals of the plurality of FET segments to selectively couple the separate control terminals of the plurality of FET segments to one of a first reference voltage terminal or a second reference voltage terminal to independently turn each FET segment on or off. An analog to digital converter has a first input terminal coupled to the first terminal of the FET, a second input terminal coupled to the second terminal of the FET and an output to provide a digital value in response to signals applied to the first input terminal and the second input terminal.

In one embodiment, the switching circuit comprises a plurality of switches. Each switch has a control terminal coupled to one of the plurality of switch control signals and a first terminal coupled to a separate control terminal of a corresponding one of the FET segments. Each switch selectively couples one of the separate control terminals of one of the plurality of FET segments to one of the first reference voltage terminal or the second reference voltage terminal to independently turn said FET segment on or off.

In one embodiment, a first number of FET segments turned on in a first system mode is less than a second number of FET segments turned on in a second system mode when the first system mode has a corresponding lower battery current than in a second system mode.

In one embodiment, the system state input includes at least one of state of clock operations, state of voltage regulators, state of software applications, state of current draw, and system mode.

In one embodiment, the analog to digital converter has a third terminal to receive the switch control signals to scale the digital value based on the switch control signals.

In another embodiment, a circuit comprises a battery field-effect transistor (FET) having a first terminal configured to be coupled to a battery and a second terminal configured to be coupled to an electronic system. Current from the battery flows through the battery FET to the electronic system. A replica FET has a first terminal configured to be coupled to the battery and a second terminal Current from the battery flows through the replica FET from the first terminal to the second terminal One of the battery FET and the replica FET comprises a plurality of parallel FET segments having separate control terminals. A logic block has an input to receive a system state input and an output to provide a plurality of switch control signals based on the system state input. A switching circuit has first terminals coupled to the plurality of switch control signals and second terminals independently coupled to the separate control terminals of the plurality of FET segments to selectively couple the separate control terminals of the plurality of FET segments to one of a first reference voltage terminal or a second reference voltage terminal to independently turn each FET segment on or off. A current sensing circuit has a first terminal coupled to the second terminal of the battery FET, a second terminal coupled to the second terminal of the replica FET and an output terminal to provide a voltage indicative of the current flowing through the replica FET. An analog to digital converter has an input terminal coupled to the output terminal of the current sensing circuit to provide a digital value in response to signals applied to the input terminal.

In one embodiment, the battery FET comprises the plurality of parallel FET segments.

In one embodiment, the replica FET comprises the plurality of parallel FET segments.

In one embodiment, the switching circuit comprises a plurality of switches. Each switch has a control terminal coupled to one of the plurality of switch control signals and a first terminal coupled to a separate control terminal of a corresponding one of the FET segments. Each switch selectively couples one of the separate control terminals of one of the plurality of FET segments to one of the first reference voltage terminal or the second reference voltage terminal to independently turn said FET segment on or off.

In one embodiment, a first number of FET segments turned on in a first system mode is less than a second number of FET segments turned on in a second system mode when the first system mode has a corresponding lower battery current than in a second system mode.

In one embodiment, the system state input includes at least one of state of clock operations, state of voltage regulators, state of software applications, state of current draw, and system mode.

In one embodiment, the analog to digital converter has a second terminal to receive the switch control signals to scale the digital value based on the switch control signals.

In another embodiment, a circuit comprises a battery field-effect transistor (FET) having a first terminal configured to be coupled to a battery and a second terminal configured to be coupled to an electronic system. Current from the battery flows through the battery FET to the electronic system. A replica FET has a first terminal configured to be coupled to the battery and a second terminal Current from the battery flows through the replica FET from the first terminal to the second terminal. A current sensing circuit has a first terminal coupled to the second terminal of the battery FET, a second terminal coupled to the second terminal of the replica FET and an output terminal to provide a voltage indicative of the current flowing through the replica FET. The current sensing circuit comprises a plurality of resistor segments having separate control terminals. A logic block has an input to receive a system state input and an output to provide a plurality of switch control signals to independently disable or enable each resistor segment based on the system state input. An analog to digital converter has an input terminal coupled to the output terminal of the current sensing circuit to provide a digital value in response to signals applied to the input terminal.

In one embodiment, the current sensing circuit comprises a first resistor coupled in parallel to the plurality of resistor segments. Each resistor segment comprises a second resistor and a switch coupled in parallel to the second resistor. The switch is coupled to the control terminal of the resistor segment.

In one embodiment, the current sensing circuit comprises a first resistor coupled in series with the plurality of resistor segments. Each resistor segment comprises a second resistor and a switch coupled in parallel to the second resistor. The switch is coupled to the control terminal of the resistor segment.

In one embodiment, the system state input includes at least one of state of clock operations, state of voltage regulators, state of software applications, state of current draw, and system mode.

In one embodiment, the analog to digital converter has a second terminal to receive the switch control signals to scale the digital value based on the switch control signals.

In another embodiment, a method comprises coupling a battery current between an electronic system and a battery through a field-effect transistor (FET), wherein the FET comprises a plurality of parallel segments having separate control terminals. The method further comprises receiving a system state input in a logic block and producing a plurality of switch control signals based on the system state input; selectively activating a plurality of switches using the switch control signals, wherein the plurality of switches selectively couple the separate control terminals of the plurality of FET segments to one of a first reference voltage or a second reference voltage to independently turn each FET segment on or off; and converting a voltage across one or more of the FET segments to a digital value.

In one embodiment, the method further comprises turning on a first number of FET segments in a first system mode, and turning on a second number of FET segments in a second system mode. The first number of FET segments is less than the second number of FET segments when the first system mode has a corresponding lower battery current than in a battery current in the second system mode.

In one embodiment, the system state input includes at least one of state of clock operations, state of voltage regulators, state of software applications, state of current draw, and system mode The following detailed description and accompanying drawings provide a better understanding of the nature and advantages of the present disclosure.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, make apparent to those of skill in the art how embodiments in accordance with the present disclosure may be practiced. In the accompanying drawings.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 5:
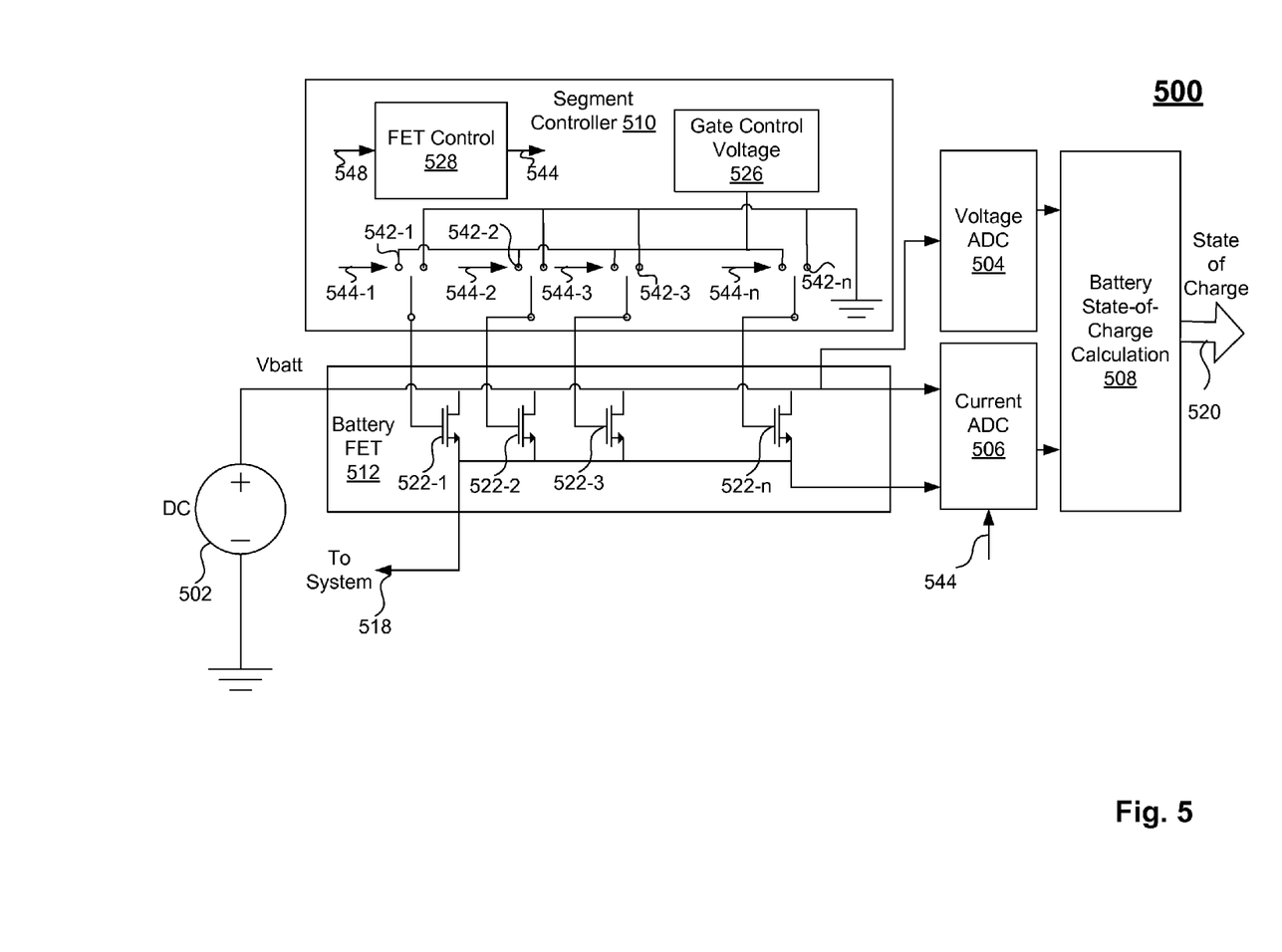
FIG. 5 illustrates a block diagram of a battery fuel gauge including a multi-segment battery FET configuration according to an embodiment.

FIG. 5 illustrates a block diagram of a battery fuel gauge 500 including a multi-segment battery FET configuration according to an embodiment. The battery fuel gauges described herein can be implemented in a power management integrated circuits ("PMIC"). Battery fuel gauge 500 comprises a battery 502, a voltage analog to digital converter (ADC) 504, a current ADC 506, a battery state-of-charge calculation block 508, a segment controller 510, and a battery FET circuit 512. Battery 502 applies battery voltage Vbatt to voltage ADC 504, which converts the battery voltage Vbatt into a digital value.

Battery FET circuit 512 couples battery voltage Vbatt to an external electronic system via node 518 responsive to a control signal or control signals from gate controller 510 in response to system states or modes. Gate controller 510 controls battery FET circuit 512 to control the resistance in the current path between battery 502 and the external electronic system via node 518. The controllable resistance can be set based on the control signal or control signals from gate controller 510. In one embodiment, the system modes are sleep mode (or standby mode) and active mode. Various embodiments of system states and modes are described in conjunction with FIG. 11.

Segment controller 510 comprises a gate control voltage block 526, a FET control block 528, and a plurality of switches 542-1 through 542-n that form a switching circuit. In response to system inputs 548 (e.g., system states or modes), FET control block 528 provides switch control signals 544-1 through 544-n to switches 542-1 through 544-n, respectively, to selectively and independently couple a first reference voltage from gate control voltage block 526 or a second reference voltage, such as ground, to battery FET circuit 512 for controlling the overall ON resistance Rds(on) of battery FET circuit 512. Switch 544 can be implemented as one or more transistors.

Battery FET circuit 512 comprises multiple segments 522-1 through 522-n that may each be turned on independently. In some embodiments, the segments 522-1 through 522-n are segments that are each formed of one or more FETs, which are referred to hereinafter also as FETs 522 or battery FET segments 522. Segment controller 510 may turn on different FETs 522 based on the state of a system, which may correspond to an amount of power drawn from battery 502. Gate voltage control block 526 is selectively coupled through "n" switches 542 to selectively turn each battery FET segment 522 on or off. Accordingly, different system inputs 548 (e.g., system states) may cause different battery FET segments 522 to be on and off. In one example, in a low battery current sleep mode, a low number of battery FET segments 522 may be turned on. This produces a higher value of the ON resistance Rds(on) of FETs 522 and larger voltages into the current ADC 506. Alternatively, in a high battery current operational mode, a larger number of battery FET segments 522 may be turned on. This produces a lower value of the ON resistance Rds(on) of FETs 522 and minimal power loss. Switch control signals 544 may also be coupled to current ADC 506 so that proper scaling of the digital current value may be performed.

Current ADC 506 converts the voltage across the FET segments 522 into a digital value. Battery state-of-charge calculation block 508 determines a state of charge 520 of the battery 502 from the digital battery voltage from voltage ADC 504 and battery current measurements from current ADC 506.

Figure 6:
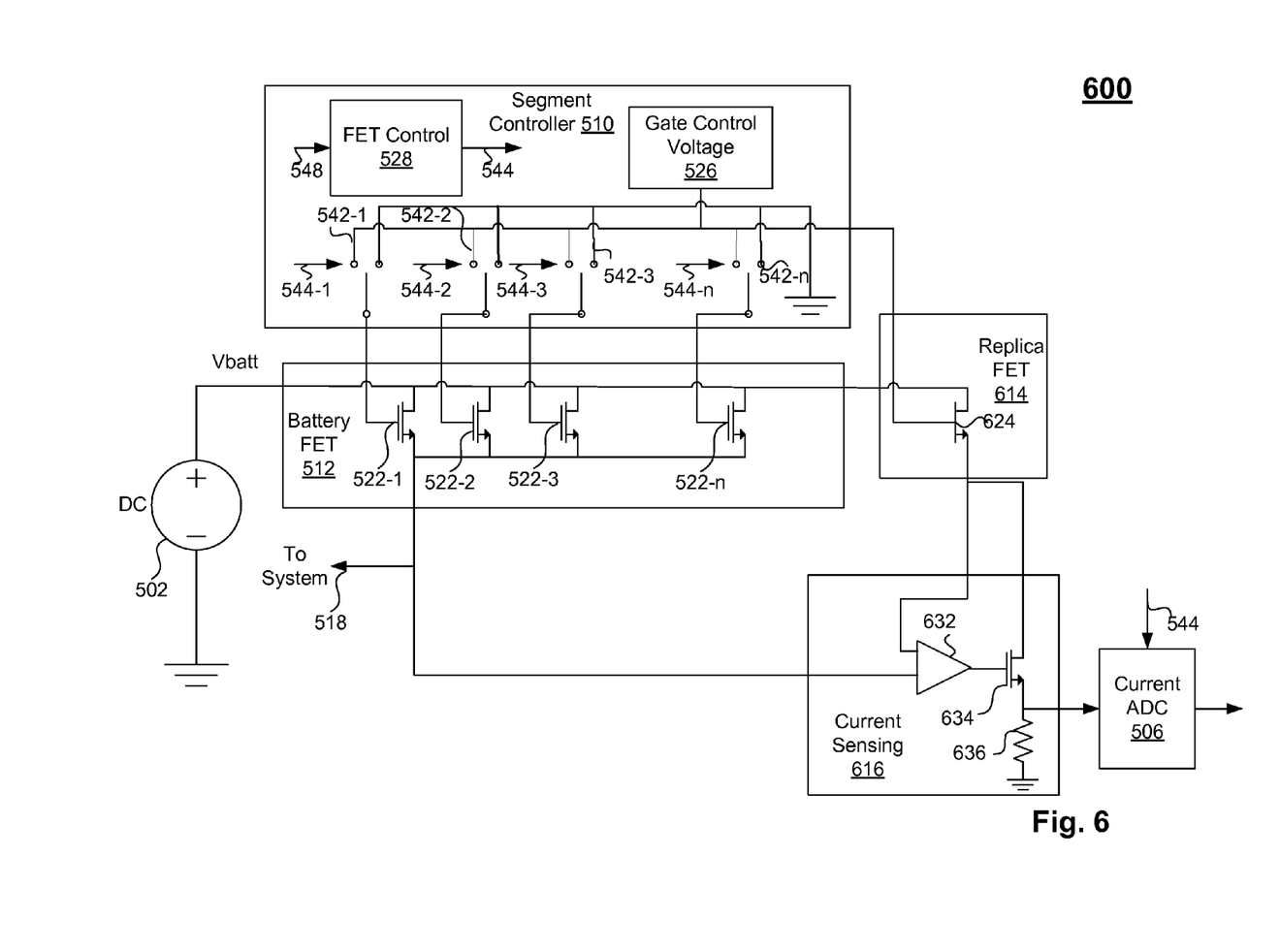
FIG. 6 illustrates a block diagram of a battery fuel gauge including a multi-segment battery FET configuration with replica FET according to an embodiment.

FIG. 6 illustrates a block diagram of a battery fuel gauge 600 according to an embodiment. Battery fuel gauge 600 comprises multi-segment battery FET circuit 512, a replica FET circuit 614, a current sensing circuit 616, and current ADC 506 according to an embodiment. Battery fuel gauge 600 further comprises voltage ADC 504 and battery state-of-charge calculation block 508, which are arranged in a similar manner as in the battery fuel gauge 500, and, for simplicity and clarity, are not shown in FIG. 6.

As described in conjunction with FIG. 5, segment controller 510 and battery FET circuit 512 selectively and independently turn on battery FET segments 522 to control the current flowing through battery FET circuit 512 to the external electronic system via node 518 and to current sensing circuit 616.

Replica FET circuit 614 couples battery 502 to current sensing circuit 616 to provide a current that mirrors, and is scaled relative to, the primary current from battery FET circuit 512. Replica FET circuit 614 comprises a FET 624. In one embodiment, the ON resistance Rds(on) of replica FET circuit 614 is 10,000 times the ON resistance Rds(on) of one FET segment 522.

Current sensing circuit 616 detects the current flowing through replica FET circuit 614 and battery FET circuit 512 and provides a battery current signal to current ADC 506. In some embodiments, current sensing circuit 616 comprises an operational amplifier 632, a FET 634, and a resistor 636.

Figure 7:
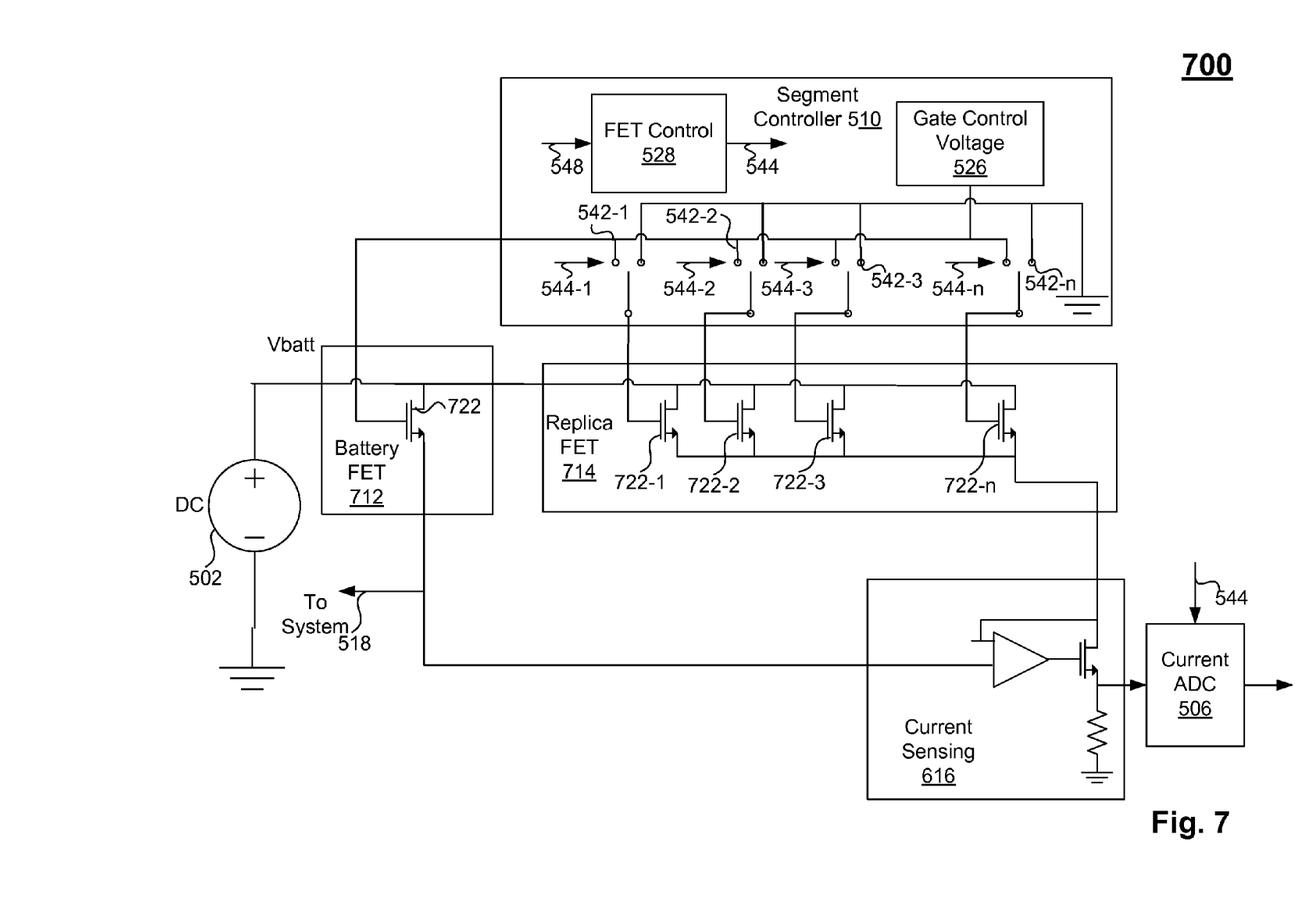
FIG. 7 illustrates a block diagram of a battery fuel gauge including a multi-segment battery FET configuration with replica FET segment control according to an embodiment.

FIG. 7 illustrates a block diagram of a battery fuel gauge 700 according to an embodiment. Battery fuel gauge 700 comprises a battery FET circuit 712, segment controller 510, a replica FET circuit 714, current sensing circuit 516, and current ADC 506. Battery fuel gauge 700 further comprises voltage ADC 504 and battery state-of-charge calculation block 508, which are arranged in a similar manner as in the battery fuel gauge 500, and, for simplicity and clarity, are not shown in FIG. 7. Battery FET circuit 712 comprises a FET 722.

In response to system inputs 548 (e.g., system states or modes), FET control block 528 provides switch control signals 544-1 through 544-n to switches 542-1 through 544-n, respectively, to selectively and independently couple a first reference voltage from gate control voltage block 526 or a second reference voltage, such as ground, to replica FET circuit 714 for controlling the overall ON resistance Rds(on) of replica FET circuit 714.

Replica FET circuit 714 comprises multiple segments 722-1 through 722-n that may each be turned on independently. In some embodiments, the segments 722-1 through 722-n are segments that are each formed of one or more FETs, which are referred to hereinafter also as FETs 722 or replica FET segments 722. Segment controller 510 may turn on different FETs 722 based on the state of the external electronic system, which may correspond to an amount of power drawn from battery 502. Gate voltage control block 526 is selectively coupled through "n" switches 542 to selectively turn each replica FET segment 722 on or off. Accordingly, different system inputs 548 (e.g., system states) may cause different FET segments 722 to be on and off. In one example, in a low battery current sleep mode, a large number of replica FET segments 722 may be turned on to increase replica current gain. This produces a lower value of the ON resistance Rds(on) of FETs 722, higher current fed to the sensing circuit 616, and larger voltages into the current ADC 506. Alternatively, in a high battery current operational mode, a low number of replica FET segments 722 may be turned on to reduce replica current gain. This produces a higher value of drain-source resistance Rds(on) of FETs 722 and minimal power loss. Switch control signals 544 may also be coupled to current ADC 506 so that proper scaling of the digital current value may be performed. Current sensing circuit 616 detects the current flowing through replica FET circuit 614 and battery FET circuit 512 and provides a battery current signal to current ADC 506.

In some embodiments, battery fuel gauge 700 can include a battery FET circuit 512 instead of battery FET circuit 712 and another segment controller 510 for controlling battery FET circuit 512. Such a battery fuel gauge 700 includes FET segments for both battery FET circuit 512 and replica FET circuit 714 for controlling ON resistance Rds(on).

Figure 8:
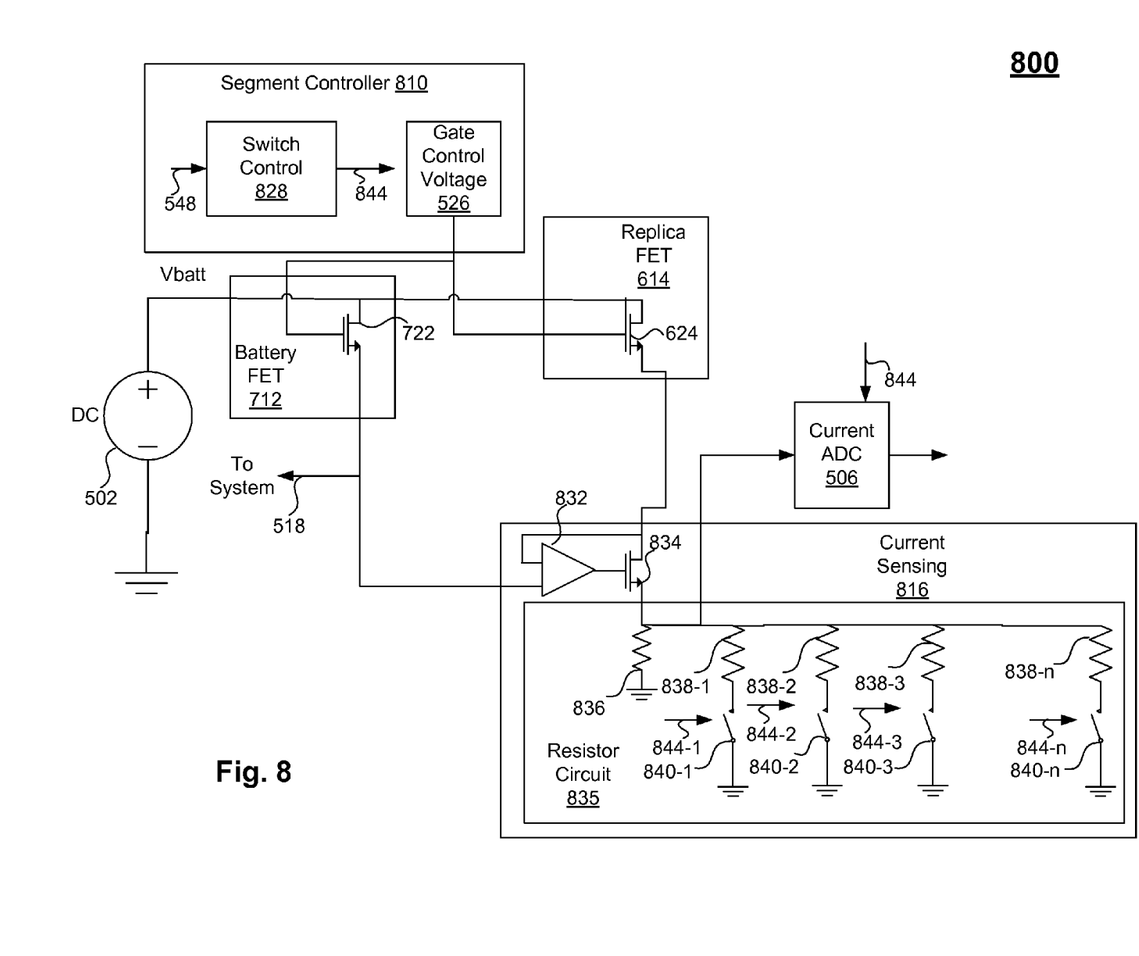
FIG. 8 illustrates a block diagram of a battery fuel gauge including variable resistance to scale control according to an embodiment.

FIG. 8 illustrates a block diagram of a battery fuel gauge 800 using variable resistance to scale control according to an embodiment. Battery fuel gauge 800 comprises battery FET circuit 712, replica FET circuit 614, current ADC 506, a segment controller 810, and a current sensing circuit 816. Battery fuel gauge 800 further comprises voltage ADC 504 and battery state-of-charge calculation block 508, which are arranged in a similar manner as in the battery fuel gauge 500, and, for simplicity and clarity, are not shown in FIG. 8. In a third technique of using a replica current, the voltage generating resistance providing a voltage to current ADC 506 is modified. More particularly, battery FET circuit 512 and replica FET circuit 614 are fixed, and the resistance of current sensing circuit 816 is modified.

Segment controller 810 comprises gate control block 526 and a switch control block 828 that generates control signals 844 in response to system inputs 548.

Current sensing circuit 816 comprises an operational amplifier 832, a FET 834, and a resistor circuit 835. Resistor circuit 835 comprises a resistor 836, a plurality of resistors 838-1 through 838-n, and a plurality of switches 840-1 through 840-n. Resistors 838 and switches 840 are coupled serially between FET 834 and ground to form selectable resistor segments that are coupled in parallel to each other and to resistor 836. Switch 840 is enabled (e.g., opened) or disabled (e.g., closed) to include or remove, respectively, the resistor segment in response to switch control signals 844 from segment controller 810. Switch 840 can be implemented as one or more transistors.

When the external system current is high (e.g., the current through battery FET circuit 512 is high), switch control block 828 decreases the resistance of resistor circuit 838 by closing switches 840 to include parallel resistor segments. When the external system current is low (e.g., the current through battery FET circuit 512 is low), switch control block 828 increases the resistance of resistor circuit 835 by opening switches 840 to remove parallel resistor segments.

In some embodiments, battery fuel gauge 800 can include a battery FET circuit 512 instead of battery FET circuit 712 and a segment controller 510 for controlling battery FET circuit 512 or can include a replica FET circuit 714 instead of replica FET circuit 614 and a segment controller 510 for controlling replica FET circuit 614, or both a battery FET circuit 512 and a replica FET circuit 714 with associated segment controllers 510. Such battery fuel gauge 800 includes FET segments either battery FET circuit 512 and replica FET circuit 714 or both for controlling ON resistance Rds(on) in addition to controlling resistor segments.

Figure 9:
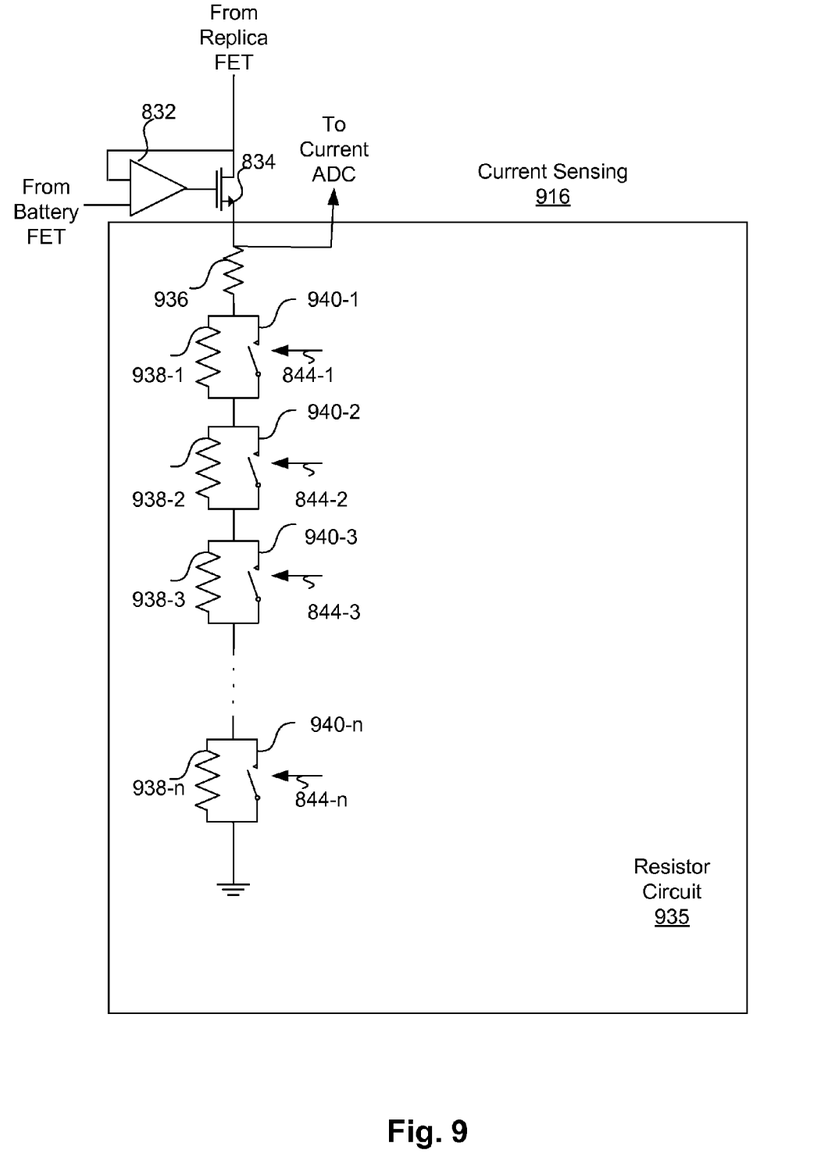
FIG. 9 illustrates a block diagram of a current sensing circuit according to an embodiment.

FIG. 9 illustrates a block diagram of a current sensing circuit 916 according to an embodiment. Current sensing circuit 916 can be used as an alternative to current sensing circuit 816 of battery fuel gauge 800. Current sensing circuit 916 comprises operational amplifier 832, FET 834 and a resistor circuit 935 arranged in a similar manner as current sensing circuit 816 of battery fuel gauge 800.

Resistor circuit 935 comprises a resistor 936, a plurality of resistors 938-1 through 938-n, and a plurality of switches 940-1 through 940-n. Resistors 938 and switches 940 are coupled in parallel to form selectable resistor segments that are coupled in series between resistor 936 and ground. Switch 940 is enabled (e.g., opened) or disabled (e.g., closed) to include or remove (by shorting the resistor 938), respectively, the resistor segment in response to switch control signals 844 from segment controller 810. Switch 940 can be implemented as one or more transistors.

When the external system current is high (e.g., the current through battery FET circuit 512 is high), switch control block 828 decreases the resistance of resistor circuit 935 by closing switches 940 to remove serial resistor segments. When the external system current is low (e.g., the current through battery FET circuit 512 is low), switch control block 828 increases the resistance of resistor circuit 935 by opening switches 940 to include serial resistor segments.

Figure 10:
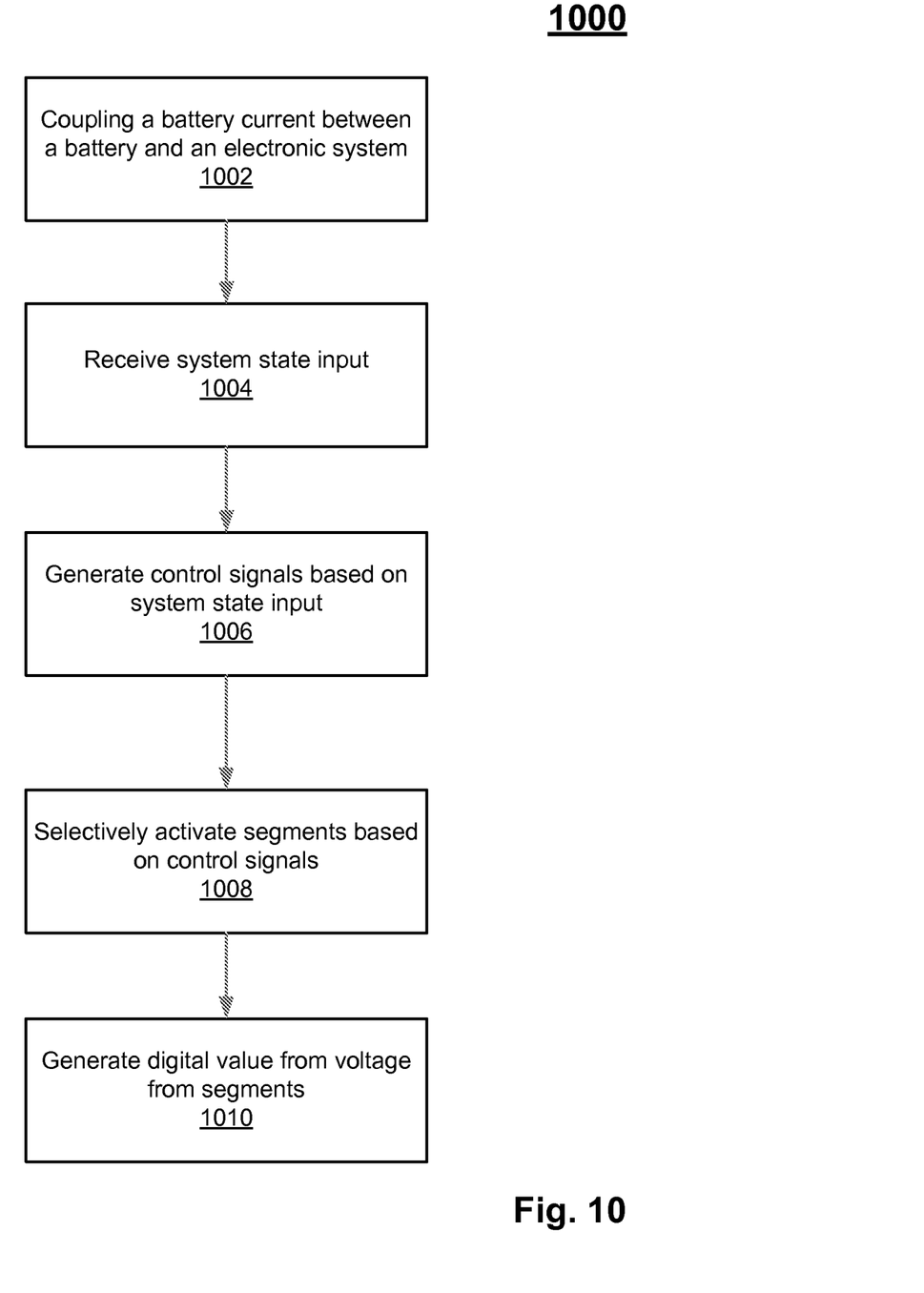
FIG. 10 illustrates a simplified diagram illustrating a process flow for measuring battery current according to an embodiment.

FIG. 10 illustrates a simplified diagram illustrating a process flow 1000 for measuring battery current according to an embodiment. Process flow 1000 is described for battery fuel gauge 500, but it is understood that process flow 1000 can be applied to battery fuel gauges 600, 700 and 800 with appropriate modification for replica FET segments or resistor segments. At 1002, battery FET circuit 512 couples a battery current between the external electronic system via node 518 and battery 502. At 1004, FET control block 528 receives system inputs 548. At 1006, FET control block 528 generates switch control signals 544 based on system inputs 548 and, at 1008, selectively activates switches 542 using switch control signals 544. Responsive to switch control signals 544, switches 542 couple the separate control terminals of the plurality of battery FET segments 522 to one of a first reference voltage of gate control block 526 or a second reference voltage (e.g., ground) to independently turn each battery FET segment 522 on or off. At 1010, current sensing circuit 516 generates a voltage based on currents through the turns on battery FET segments 522. Current ADC 506 converts the voltage across one or more of the battery FET segments 522 to a digital value.

Figure 11:
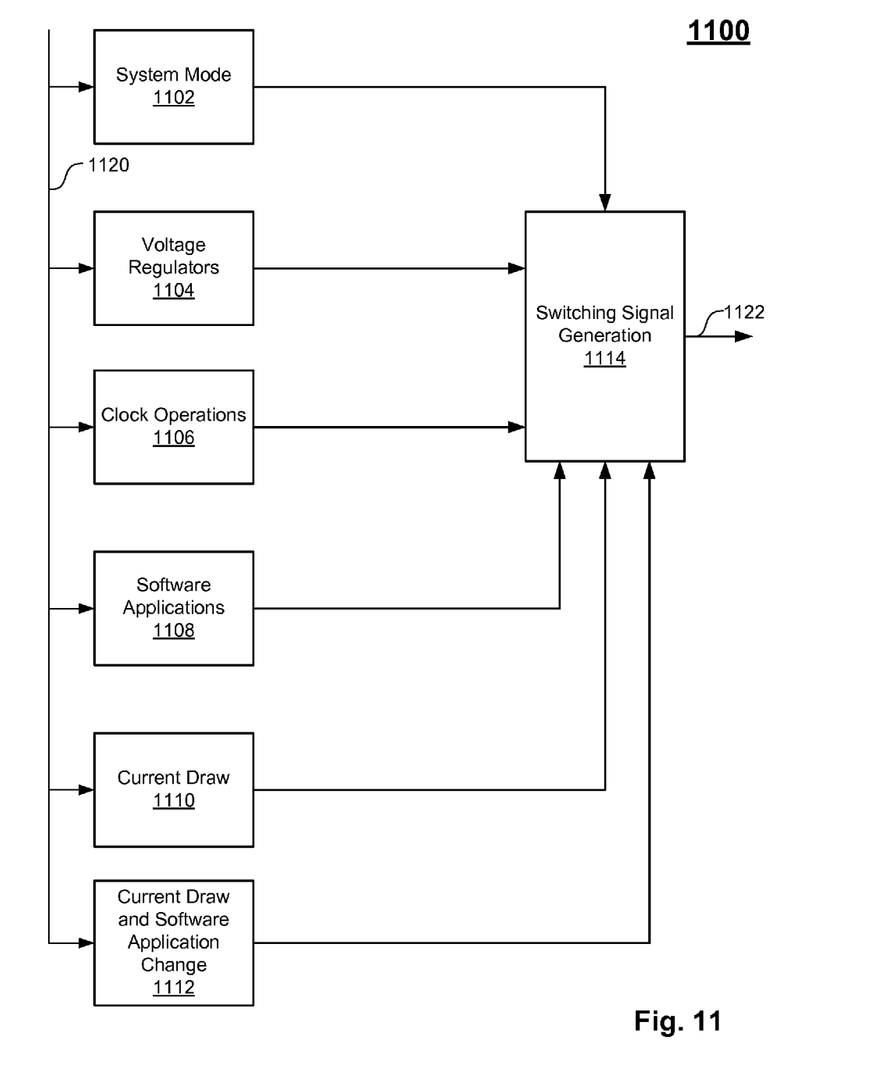
FIG. 11 illustrates a block diagram of a FET control circuit according to an embodiment.

FIG. 11 illustrates a block diagram of a FET control circuit 1100 according to an embodiment. FET control circuit 1100 provides segment control signals 1122 in response to system input signals 1120. In various embodiments, FET control circuit 1100 can be FET control block 528 or switch control block 828, system input signals 1120 can be system inputs 548, and control signals 1122 can be switch control signals 544 or switch control signals 844. FET control circuit 1100 can be a hardware state machine or software executed in a processor or a combination of both.

FET control circuit 1100 comprises a system mode block 1102, a voltage regulators block 1104, a clock operations block 1106, a software applications block 1108, a current draw block 1110, a current draw and software application change block 1112, and a switching signal generation block 1114.

System mode block 1102 receives a system signal indicative of whether the system is in an active mode or a sleep/standby mode. In an active mode, current can be high, and switching signal generation block 1114 can set most or all segments to be on. In sleep/standby mode, current is low, and switching signal generation block 1114 can set minimal or few segments to be on.

The external electronic system knows the state of each voltage regulator. Voltage regulators block 1104 uses a state of each voltage regulator in the external electronic system to determine the system current and the associated segment or resistance configuration. The external electronic system provides the state information of the voltage regulator that includes the on/off status and the normal power or low power status. Based on each current capacity and state of each voltage regulator, voltage regulators block 1104 selects the appropriate number of segments.

Clock operations block 1106 uses the system clock distribution and settings to determine the current draw in the system and to determine the number of segments or resistance. Clock distribution control signals (e.g., internal to the PMIC) can be provided to the clock operations block 1106 to control the FET segments or resistor segments. In some embodiments, clock operations block 1106 receives processor clock phase lock loop (PLL) settings to fine tune the number of segments. In one embodiment, the clock PLL settings are received by the PMIC via a System Power Management Interface (SPMI) command.

Software applications block 1108 controls the number of activated FET segments or resistor segments based on the number and type of features or functions of the software of the external electronic system that are in operation. Software applications block 1108 track the software features in use, maps each features to a level of current, sums the current, and decides the appropriate number of segments that are to be activated. In some embodiments, software applications block 1108 runs on an application processor in the external electronic system controls the FET segments or resistor segments via the System Power Management Interface (SPMI).

Current draw block 1110 uses system current measures to determine the operational number of segments or resistance. In various embodiments, current draw block 1110 uses an assignment of current bands to the number of segments to determine when to switch from one number of operational segments to the next number. In some embodiments, the current bands are configured with some overlap and some hysteresis to cover transitions cleanly and at a proper rate. In some embodiments, current draw block 1110 runs on an application processor in the external electronic system controls the FET segments or resistor segments via the System Power Management Interface (SPMI).

Current draw and software application change block 1112 uses the level of system current and software knowledge of when a software feature is either being turned on or off to determine the operational number of FET segments or resistor segments. Current draw and software application change block 1112 maintains a table of expected currents for various software features. Based on the measured system current and the expected current change for the new feature being turned on or off, current draw and software application change block 1112 calculates the anticipated current and sets the number of segments based on the anticipated current. Software running on the application processor in the external electronic system reads current periodically, and is, or is made, aware of changes in the user interface to start or stop software applications. Current draw and software application change block 1112 uses current and pending feature changes to determine the operational number of segments. In some embodiments, current draw and software application change block 1112 runs on an application processor in the external electronic system controls the FET segments or resistor segments via the System Power Management Interface (SPMI).

Switching signal generation block 1114 generates segment control signals 1122 based on the state of the system current and system status as determined by one or more of system mode block 1102, voltage regulators block 1104, clock operations block 1106, software applications block 1108, current draw block 1110, and current draw and software application change block 1112.

In some embodiments, FET control circuit 1100 sets the ON resistance Rds (on) of the FET segments based on the mode of operation. For example, in a two mode operation, when the system is in active mode, FET control circuit 1100 turns on all segments to maintain, for example, a 10 mΩ resistance value. When the system is in sleep/standby, turn off, for example, 90% of the segments to increase the ON resistance Rds(on) to, for example, 100 mΩ. This produces a 10 times increase in the sleep current signal to noise ratio (SNR). In typical systems, the system being in either active or standby mode of operation is determined by a single signal state.

In some embodiments, FET control circuit 1100 dynamically scales the ON resistance Rds (on) of the FET segments across the entire range of operation based on the current read in the prior measurement. FET control circuit 1100 can include bins for various current ranges to provide switch points. The ON resistance Rds (on) resulting from the active FET segments can be used to scale the output of the current ADC 506 to generate the proper current value.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A circuit comprising:
    a field-effect transistor (FET) coupled between a battery and an electronic system, the FET having a first terminal configured to be coupled to the battery and a second terminal configured to be coupled to the electronic system, wherein current from the battery flows through the FET between the battery and the electronic system, and wherein the FET comprises a plurality of FET segments coupled in parallel by coupling sources of each of the plurality of FET segments and coupling drains of each of the plurality of FET segments, and each of the plurality of FET segments having separate control terminals;
    a logic block having an input to receive a system state input and having an output to provide a plurality of switch control signals based on the system state input;
    a switching circuit having first terminals coupled to the plurality of switch control signals and having second terminals independently coupled to the separate control terminals of the plurality of FET segments and configured to selectively couple the separate control terminals of the plurality of FET segments to one of a first reference voltage terminal or a second reference voltage terminal to independently apply the first reference voltage or the second reference voltage to the control terminal of each FET to turn each FET segment on or off, wherein the switching circuit is configured to control a resistance in a current path between the battery and the electronic system; and an analog to digital converter having a first input terminal coupled to the first terminal of the FET, having a second input terminal coupled to the second terminal of the FET and having an output to provide a digital value corresponding to a voltage difference across the first and the second terminals of the FET, the voltage difference across the first and the second terminals of the FET is configured to represent a direct measure of a current flowing in the current path between the battery and the electronic system.

2. The circuit of claim 1 wherein the switching circuit comprises a plurality of switches, each switch of the plurality of switches having a control terminal coupled to one of the plurality of switch control signals and a first terminal of each of the plurality of switches coupled to a separate control terminal of a corresponding one of the FET segments, wherein each switch selectively couples one of the separate control terminals of one of the plurality of FET segments to one of the first reference voltage terminal or the second reference voltage terminal to independently turn said FET segment on or off.

3. The circuit of claim 1 wherein a first number of FET segments turned on in a first system mode is less than a second number of FET segments turned on in a second system mode when the first system mode has a corresponding lower battery current than in a second system mode.

4. The circuit of claim 1 wherein the system state input includes at least one of state of clock operations, state of voltage regulators, state of software applications, state of current draw, and system mode.

5. The circuit of claim 1 wherein the analog to digital converter has a third terminal to receive the switch control signals to scale the digital value based on the switch control signals.

6. A method comprising:
coupling a battery current between an electronic system and a battery through a field-effect transistor (FET) between the battery and the electronic system, wherein the FET comprises a plurality of FET segments coupled in parallel by coupling sources of each of the plurality of FET segments together and coupling drains of each of the plurality of FET segments together, and wherein each of the FET segments having separate control terminals;

receiving a system state input in a logic block and producing a plurality of switch control signals based on the system state input;

selectively activating a plurality of switches using the switch control signals, wherein the plurality of switches selectively couple the separate control terminals of each of the plurality of FET segments to one of a first reference voltage or a second reference voltage to independently apply the first reference voltage or the second reference voltage to the control terminal of each FET to turn each FET segment on or off, wherein the switch control signals are configured to control a resistance in a current path between the battery and the electronic system; and converting a voltage difference across the coupled-together sources and the coupled-together drains of the plurality of the FET segments to a digital value, the voltage difference is configured to represent a direct measure of a current flowing in the current path between the battery and the electronic system.

7. The method of claim 6 further comprising:
turning on a first number of FET segments in a first system mode; and
turning on a second number of FET segments in a second system mode,
wherein the first number of FET segments is less than the second number of FET segments when the first system mode has a corresponding lower battery current than in a battery current in the second system mode.

8. The method of claim 6 wherein the system state input includes at least one of state of clock operations, state of voltage regulators, state of software applications, state of current draw, and system mode.

* * * * *